(12) United States Patent
Majumder et al.

(10) Patent No.: US 10,467,371 B1
(45) Date of Patent: Nov. 5, 2019

(54) SYSTEM, METHOD, AND COMPUTER PROGRAM PRODUCT FOR FLOORPLANNING IN AN ELECTRONIC CIRCUIT DESIGN

(71) Applicant: Cadence Design Systems, Inc., San Jose, CA (US)

(72) Inventors: Chayan Majumder, Uttar Pradesh (IN); Arnold Jean Marie Gustave Ginetti, Antibes (FR)

(73) Assignee: Cadence Design Systems, Inc., San Jose, CA (US)

( * ) Notice: Subject to any disclaimer, the term of this patent is extended or adjusted under 35 U.S.C. 154(b) by 125 days.

(21) Appl. No.: 15/493,579

(22) Filed: Apr. 21, 2017

(51) Int. Cl.
*G06F 17/50* (2006.01)

(52) U.S. Cl.
CPC ................ *G06F 17/5072* (2013.01)

(58) Field of Classification Search
USPC .......................................... 716/118
See application file for complete search history.

(56) References Cited

U.S. PATENT DOCUMENTS

| | | | |
|---|---|---|---|
| 2004/0163056 A1* | 8/2004 | Frank | G06F 17/5081 716/112 |
| 2004/0163058 A1* | 8/2004 | Frank | G06F 17/5081 716/112 |
| 2007/0089087 A1* | 4/2007 | Connor | G06F 17/509 717/105 |
| 2008/0028356 A1* | 1/2008 | Aoki | G06F 17/5045 716/102 |
| 2015/0227660 A1* | 8/2015 | Agarwal | G06F 17/5022 716/139 |

* cited by examiner

*Primary Examiner* — Mohammed Alam
(74) *Attorney, Agent, or Firm* — Mark H. Whittenberger, Esq.; Holland & Knight LLP (57) ABSTRACT

The present disclosure relates to a computer-implemented method for use in an electronic circuit design. Embodiments may include receiving, using at least one processor, the electronic circuit design and displaying, via a graphical user interface, a first device associated with the electronic circuit design. Embodiments may further include displaying, via the graphical user interface, a second device associated with the electronic circuit design. Embodiments may also include displaying, via the graphical user interface, inter-device connectivity between the first device and the second device and displaying intra-device connectivity between at least one of the first device and the second device, wherein the inter-device connectivity and the intra-device connectivity are visibly distinct.

12 Claims, 12 Drawing Sheets

Only Block-A was moved, but block N on adjacent die was moved as well while retaining relative position between the blocks.

SYSTEM, METHOD, AND COMPUTER PROGRAM PRODUCT FOR FLOORPLANNING IN AN ELECTRONIC CIRCUIT DESIGN

FIELD OF THE INVENTION

The present disclosure relates to electronic design, and more specifically, to a method for floorplanning associated with electronic design.

DISCUSSION OF THE RELATED ART

In the electronic design automation ("EDA") field, a designer cannot visualize or analyze cross-die connectivity in a layout while making the floorplan. He or she has to determine the cross-die connectivity from schematics, which is a roundabout and painful method. Moreover, existing approaches do not provide any capability for 3D floorplanning, or Cross-Die floorplanning. As such, the designer must create a layout/floorplan for one die, then look at the other die, perform floorplanning there, then switch back to the previous die, perform changes there, etc. This iterative loop may continue until a meaningful floorplan for both dies is reached. This is a time consuming and painful task because there is no existing method for simultaneous cross die floorplanning.

SUMMARY OF DISCLOSURE

In one or more embodiments of the present disclosure, a computer-implemented method for use in an electronic circuit design is provided. The method may include receiving, using at least one processor, the electronic circuit design and displaying, via a graphical user interface, a first device associated with the electronic circuit design. The method may further include displaying, via the graphical user interface, a second device associated with the electronic circuit design. The method may also include displaying, via the graphical user interface, inter-device connectivity between the first device and the second device and displaying intra-device connectivity between at least one of the first device and the second device, wherein the inter-device connectivity and the intra-device connectivity are visibly distinct.

One or more of the following features may be included. In some embodiments, the method may include displaying, via the graphical user interface, a number of connected nets between the first device and the second device on the graphical user interface. The method may further include displaying, via the graphical user interface, a number of connected nets between a plurality of blocks associated with at least one of the first device and the second device on the graphical user interface. The method may also include displaying, via the graphical user interface, inter-device connectivity between the first device and the second device includes displaying cross-die pin connectivity. In some embodiments, displaying, via the graphical user interface, intra-device connectivity between at least one of the first device and the second device may include displaying same-device pin connectivity.

In some embodiments, a computer-readable storage medium for use in an electronic circuit design is provided. Operations may include receiving, using at least one processor, the electronic circuit design, wherein the electronic circuit design comprises a stacked assembly. Operations may further include displaying, via a graphical user interface, a first device associated with the stacked assembly in the electronic circuit design, wherein the first device is a die. Operations may also include displaying, via the graphical user interface, a second device associated with the stacked assembly in the electronic circuit design. Operations may further include displaying through a plurality of connected nets, via the graphical user interface, inter-device connectivity between the first device and the second device and intra-device connectivity between at least one of the first device and the second device, wherein the inter-device connectivity and the intra-device connectivity are visibly distinct.

One or more of the following features may be included. In some embodiments, operations may include displaying, via the graphical user interface, a third device associated with the stacked assembly in the electronic circuit design, wherein the second device is a package and the third device is a printed circuit board. In some embodiments, the second device may be a die. Operations may include displaying, via the graphical user interface, inter-device connectivity between the first device and the second device includes displaying cross-die pin connectivity. In some embodiments, displaying, via the graphical user interface, intra-device connectivity between at least one of the first device and the second device may include displaying same-die pin connectivity.

In one or more embodiments of the present disclosure, a system may include a computing device having at least one processor configured to receive the electronic circuit design and to display, via a graphical user interface, a first die associated with the electronic circuit design. The at least one processor further configured to display, via the graphical user interface, a second die associated with the electronic circuit design. The at least one processor further configured to display, via the graphical user interface, inter-die connectivity between the first die and the second die and to display intra-die connectivity between at least one of the first die and the second die, wherein the inter-die connectivity and the intra-die connectivity are visibly distinct.

One or more of the following features may be included. In some embodiments, the at least one processor may be configured to display, via the graphical user interface, a number of connected nets between the first die and the second die on the graphical user interface. The at least one processor may be further configured to display, via the graphical user interface, a number of connected nets between a plurality of blocks associated with at least one of the first die and the second die on the graphical user interface. In some embodiments, displaying, via the graphical user interface, inter-die connectivity between the first die and the second die may include displaying cross-die pin connectivity. In some embodiments, displaying, via the graphical user interface, intra-die connectivity between at least one of the first die and the second die may include displaying same-die pin connectivity.

In one or more embodiments of the present disclosure, a computer-implemented method for use in an electronic circuit design. The method may include receiving, using at least one processor, the electronic circuit design and displaying, via a graphical user interface, a first die associated with the electronic circuit design. The method may further include displaying, via the graphical user interface, a second die associated with the electronic circuit design. The method may also include synchronizing at least one edit of the first die with the second die and updating the graphical user interface, based upon, at least in part, the synchronizing.

One or more of the following features may be included. In some embodiments, synchronizing at least one edit includes synchronizing a plurality of blocks associated with the graphical user interface. In some embodiments, synchronizing a plurality of blocks may include synchronizing block movement or block rotation. Synchronizing a plurality of blocks may include synchronizing a stretch operation of the plurality of blocks. Synchronizing a plurality of blocks may include synchronizing one or more block edges.

Additional features and advantages of embodiments of the present disclosure will be set forth in the description which follows, and in part will be apparent from the description, or may be learned by practice of embodiments of the present disclosure. The objectives and other advantages of the embodiments of the present disclosure may be realized and attained by the structure particularly pointed out in the written description and claims hereof as well as the appended drawings.

It is to be understood that both the foregoing general description and the following detailed description are exemplary and explanatory and are intended to provide further explanation of embodiments of the invention as claimed.

BRIEF DESCRIPTION OF THE DRAWINGS

The accompanying drawings, which are included to provide a further understanding of embodiments of the present disclosure and are incorporated in and constitute a part of this specification, illustrate embodiments of the present disclosure and together with the description serve to explain the principles of embodiments of the present disclosure.

DETAILED DESCRIPTION

Reference will now be made in detail to the embodiments of the present disclosure, examples of which are illustrated in the accompanying drawings. The present disclosure may, however, be embodied in many different forms and should not be construed as being limited to the embodiments set forth herein. Rather, these embodiments are provided so that this disclosure will be thorough and complete, and will fully convey the concept of the disclosure to those skilled in the art.

As will be appreciated by one skilled in the art, the present disclosure may be embodied as a method, system, or computer program product. Accordingly, the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present disclosure may take the form of a computer program product on a computer-usable storage medium having computer-usable program code embodied in the medium.

As used in any embodiment described herein, "circuitry" may include, for example, singly or in any combination, hardwired circuitry, programmable circuitry, state machine circuitry, and/or firmware that stores instructions executed by programmable circuitry. It should be understood at the outset that any of the operations and/or operative components described in any embodiment herein may be implemented in software, firmware, hardwired circuitry and/or any combination thereof.

Any suitable computer usable or computer readable medium may be utilized. The computer readable medium may be a computer readable signal medium or a computer readable storage medium. A computer-usable, or computer-readable, storage medium (including a storage device associated with a computing device or client electronic device) may be, for example, but not limited to, an electronic, magnetic, optical, electromagnetic, infrared, or semiconductor system, apparatus, or device, or any suitable combination of the foregoing. More specific examples (a non-exhaustive list) of the computer-readable medium may include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device. In the context of this document, a computer-usable, or computer-readable, storage medium may be any tangible medium that can contain, or store a program for use by or in connection with the instruction execution system, apparatus, or device.

A computer readable signal medium may include a propagated data signal with computer readable program coded embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations of the present invention may be written in an object oriented programming language such as Java, Smalltalk, C++ or the like. However, the computer program code for carrying out operations of the present invention may also be written in conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through a local area network (LAN) or a wide area network (WAN), or the connection may be made to an external computer (for example, through the Internet using an Internet Service Provider).

The present disclosure is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instructions which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

One or more hardware description languages may be used in accordance with the present disclosure. Some hardware description languages may include, but are not limited to, Verilog, VHDL, SystemC, SystemVerilog and Verilog-AMS. Various other hardware description languages may also be used as well.

Figure 1:
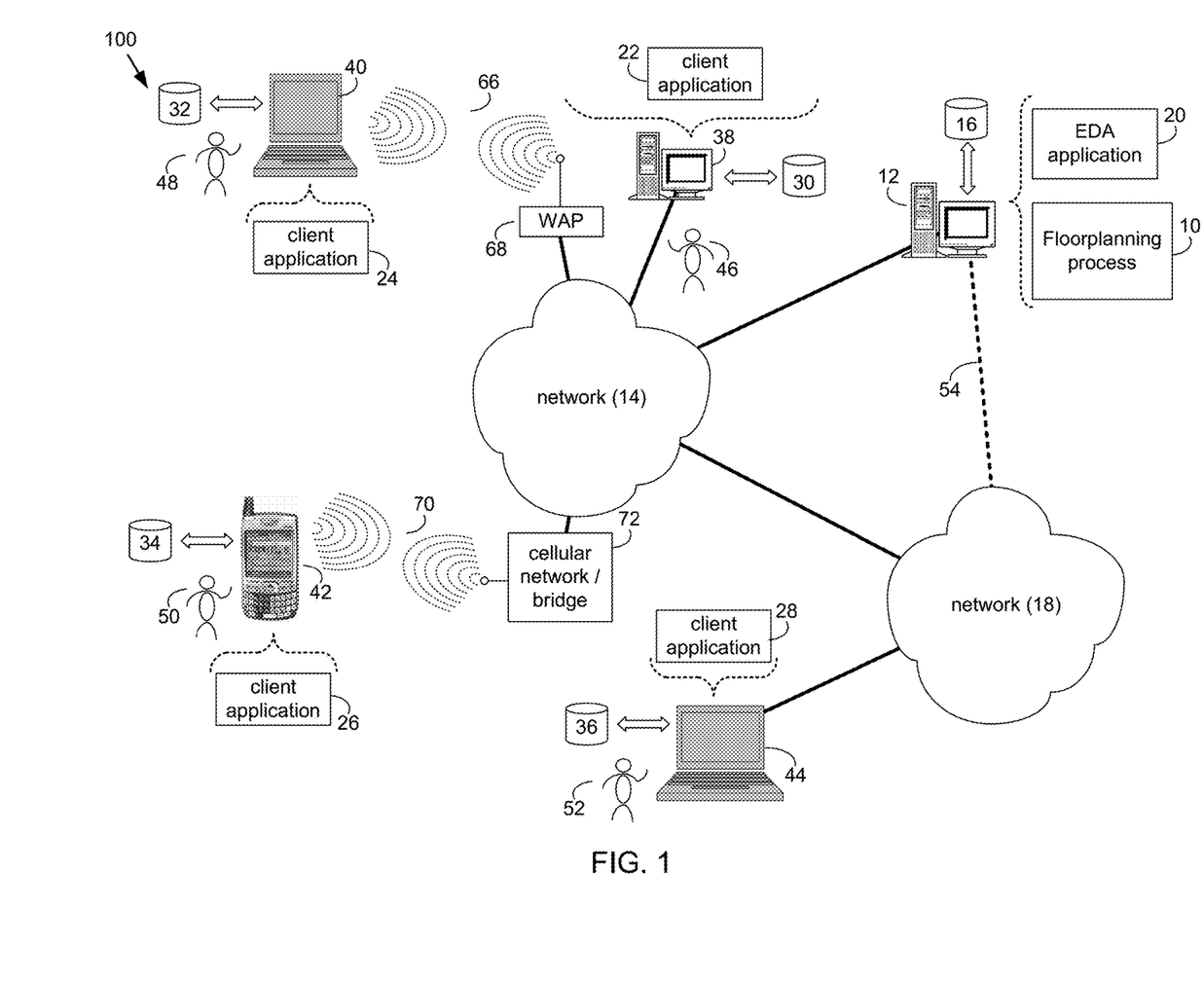
FIG. 1 is a diagram depicting an embodiment of a system in accordance with the present disclosure.

Referring to FIG. 1, there is shown a floorplanning process 10 that may reside on and may be executed by server computer 12, which may be connected to network 14 (e.g., the Internet or a local area network). Examples of server computer 12 may include, but are not limited to: a personal computer, a server computer, a series of server computers, a mini computer, and a mainframe computer. Server computer 12 may be a web server (or a series of servers) running a network operating system, examples of which may include but are not limited to: Microsoft® Windows® Server; Novell® NetWare®; or Red Hat® Linux®, for example. (Microsoft and Windows are registered trademarks of Microsoft Corporation in the United States, other countries or both; Novell and NetWare are registered trademarks of Novell Corporation in the United States, other countries or both; Red Hat is a registered trademark of Red Hat Corporation in the United States, other countries or both; and Linux is a registered trademark of Linus Torvalds in the United States, other countries or both.) Additionally,/alternatively, floorplanning process 10 may reside on and be executed, in whole or in part, by a client electronic device, such as a personal computer, notebook computer, personal digital assistant, or the like.

The instruction sets and subroutines of floorplanning process 10, which may include one or more software modules, and which may be stored on storage device 16 coupled to server computer 12, may be executed by one or more processors (not shown) and one or more memory modules (not shown) incorporated into server computer 12. Storage device 16 may include but is not limited to: a hard disk drive; a solid state drive, a tape drive; an optical drive; a RAID array; a random access memory (RAM); and a read-only memory (ROM). Storage device 16 may include various types of files and file types including but not limited, to hardware description language (HDL) files, which may contain the port type descriptions and executable specifications of hardware blocks.

Server computer 12 may execute a web server application, examples of which may include but are not limited to: Microsoft IIS, Novell Webserver™, or Apache® Webserver, that allows for HTTP (HyperText Transfer Protocol) access to server computer 12 via network 14 (Webserver is a trademark of Novell Corporation in the United States, other countries, or both; and Apache is a registered trademark of Apache Software Foundation in the United States, other countries, or both). Network 14 may be connected to one or more secondary networks (e.g., network 18), examples of which may include but are not limited to: a local area network; a wide area network; or an intranet, for example.

Server computer 12 may execute an electronic design automation (EDA) application (e.g., EDA application 20), examples of which may include, but are not limited to those available from the assignee of the present application. EDA application 20 may interact with one or more EDA client applications (e.g., EDA client applications 22, 24, 26, 28) for electronic design optimization.

Floorplanning process 10 may be a stand alone application, or may be an applet/application/script that may interact with and/or be executed within EDA application 20. In addition/as an alternative to being a server-side process, floorplanning process 10 may be a client-side process (not shown) that may reside on a client electronic device (described below) and may interact with an EDA client application (e.g., one or more of EDA client applications 22, 24, 26, 28). Further, floorplanning process 10 may be a hybrid server-side/client-side process that may interact with EDA application 20 and an EDA client application (e.g., one or more of client applications 22, 24, 26, 28). As such, floorplanning process 10 may reside, in whole, or in part, on server computer 12 and/or one or more client electronic devices.

The instruction sets and subroutines of EDA application 20, which may be stored on storage device 16 coupled to server computer 12 may be executed by one or more processors (not shown) and one or more memory modules (not shown) incorporated into server computer 12.

The instruction sets and subroutines of EDA client applications 22, 24, 26, 28, which may be stored on storage devices 30, 32, 34, 36 (respectively) coupled to client electronic devices 38, 40, 42, 44 (respectively), may be executed by one or more processors (not shown) and one or more memory modules (not shown) incorporated into client electronic devices 38, 40, 42, 44 (respectively). Storage devices 30, 32, 34, 36 may include but are not limited to: hard disk drives; solid state drives, tape drives; optical drives; RAID arrays; random access memories (RAM); read-only memories (ROM), compact flash (CF) storage devices, secure digital (SD) storage devices, and a memory stick storage devices. Examples of client electronic devices 38, 40, 42, 44 may include, but are not limited to, personal computer 38, laptop computer 40, mobile computing device 42 (such as a smart phone, netbook, or the like), notebook computer 44, for example. Using client applications 22, 24, 26, 28, users 46, 48, 50, 52 may access EDA application 20 and may allow users to e.g., utilize floorplanning process 10.

Users 46, 48, 50, 52 may access EDA application 20 directly through the device on which the client application (e.g., client applications 22, 24, 26, 28) is executed, namely client electronic devices 38, 40, 42, 44, for example. Users 46, 48, 50, 52 may access EDA application 20 directly through network 14 or through secondary network 18. Further, server computer 12 (e.g., the computer that executes EDA application 20) may be connected to network 14 through secondary network 18, as illustrated with phantom link line 54.

The various client electronic devices may be directly or indirectly coupled to network 14 (or network 18). For example, personal computer 38 is shown directly coupled to network 14 via a hardwired network connection. Further, notebook computer 44 is shown directly coupled to network 18 via a hardwired network connection. Laptop computer 40 is shown wirelessly coupled to network 14 via wireless communication channel 66 established between laptop computer 40 and wireless access point (WAP) 68, which is shown directly coupled to network 14. WAP 68 may be, for example, an IEEE 802.11a, 802.11b, 802.11g, Wi-Fi, and/or Bluetooth device that is capable of establishing wireless communication channel 66 between laptop computer 40 and WAP 68. Mobile computing device 42 is shown wirelessly coupled to network 14 via wireless communication channel 70 established between mobile computing device 42 and cellular network/bridge 72, which is shown directly coupled to network 14.

As is known in the art, all of the IEEE 802.11x specifications may use Ethernet protocol and carrier sense multiple access with collision avoidance (e.g., CSMA/CA) for path sharing. The various 802.11x specifications may use phase-shift keying (PSK) modulation or complementary code keying (CCK) modulation, for example. As is known in the art, Bluetooth is a telecommunications industry specification that allows e.g., mobile phones, computers, and personal digital assistants to be interconnected using a short-range wireless connection.

Client electronic devices 38, 40, 42, 44 may each execute an operating system, examples of which may include but are not limited to Microsoft Windows, Microsoft Windows CE®, Red Hat Linux, or other suitable operating system. (Windows CE is a registered trademark of Microsoft Corporation in the United States, other countries, or both.).

Figure 2:
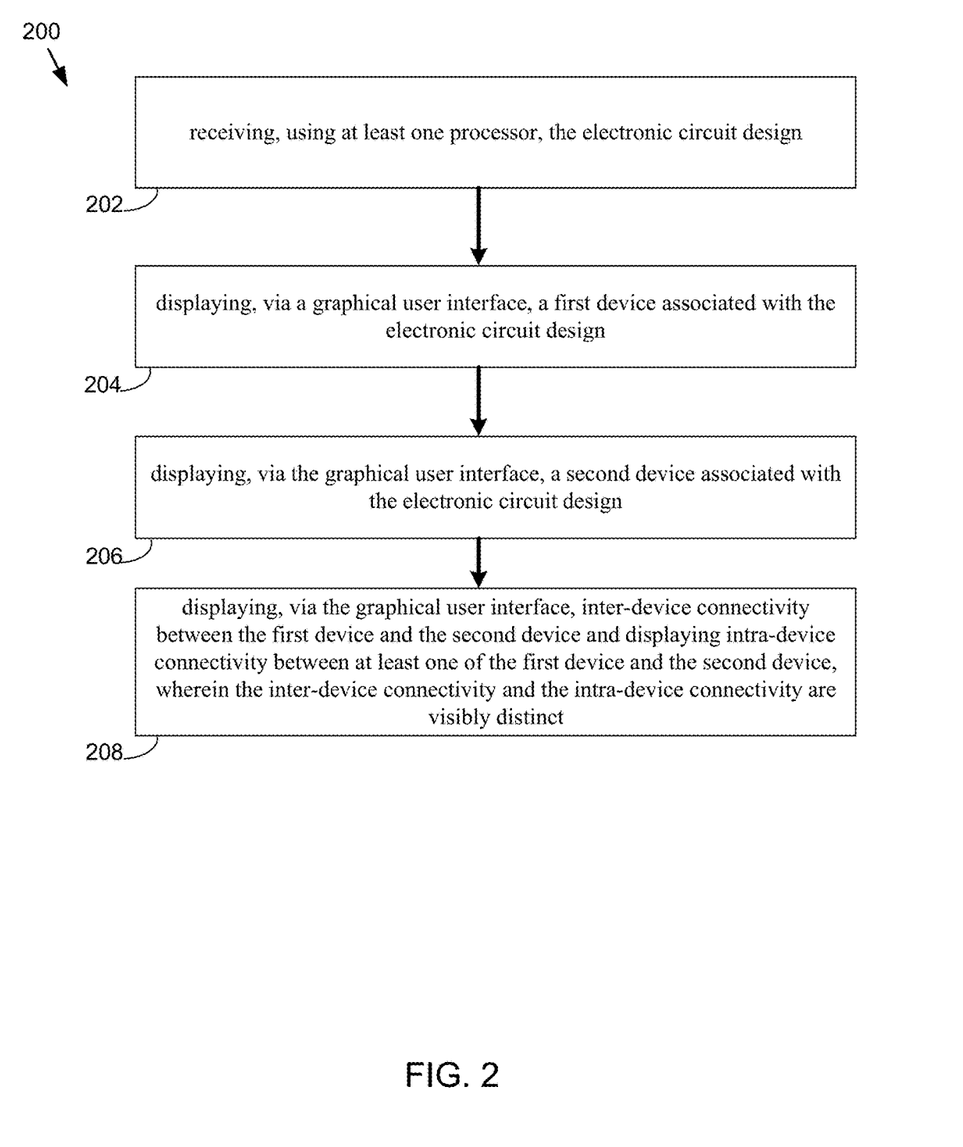
FIG. 2 is a flowchart depicting operations consistent with the floorplanning process in accordance with an embodiment of the present disclosure.

Referring now to FIG. 2, an exemplary flowchart 200 depicting operations consistent with the floorplanning process described herein is provided. Embodiments may include receiving (202), using at least one processor, the electronic circuit design and displaying (204), via a graphical user interface, a first device associated with the electronic circuit design. Embodiments may also include displaying (206), via the graphical user interface, a second device associated with the electronic circuit design and displaying (208), via the graphical user interface, inter-device connectivity between the first device and the second device and displaying intra-device connectivity between at least one of the first device and the second device, wherein the inter-device connectivity and the intra-device connectivity are visibly distinct.

A stacked assembly generally refers to a situation where multiple electronic circuits/components are stacked on each other to form one composite system. Some examples may include, but are not limited to, 3D integrated circuits ("IC") where multiple dies are stacked on each other, a Die-Package-Board where dies are placed within IC Packages and IC packages are then placed on the Board. Embodiments of the present disclosure may be used with any form of stacked assemblies.

In the example of 3DIC, previously each die needed to be designed in isolation, and with a great deal of unnecessary routing required to make the required connections between them. Embodiments of the floorplanning process 10 described herein may allow for the designing of each die while addressing the 3DIC stack. As such, floorplanning the 3DIC stack design may ensure that connectivity is simplified. The floorplan/design of each device (e.g., each die) should be done such that it optimal inter-device connectivity and optimal intra-device die connectivity is achieved. Similarly, in the example of die-package-board, each of them should be designed such that they are optimal at their individual design levels, and also optimal across the stack with respect to each other.

Figure 3:
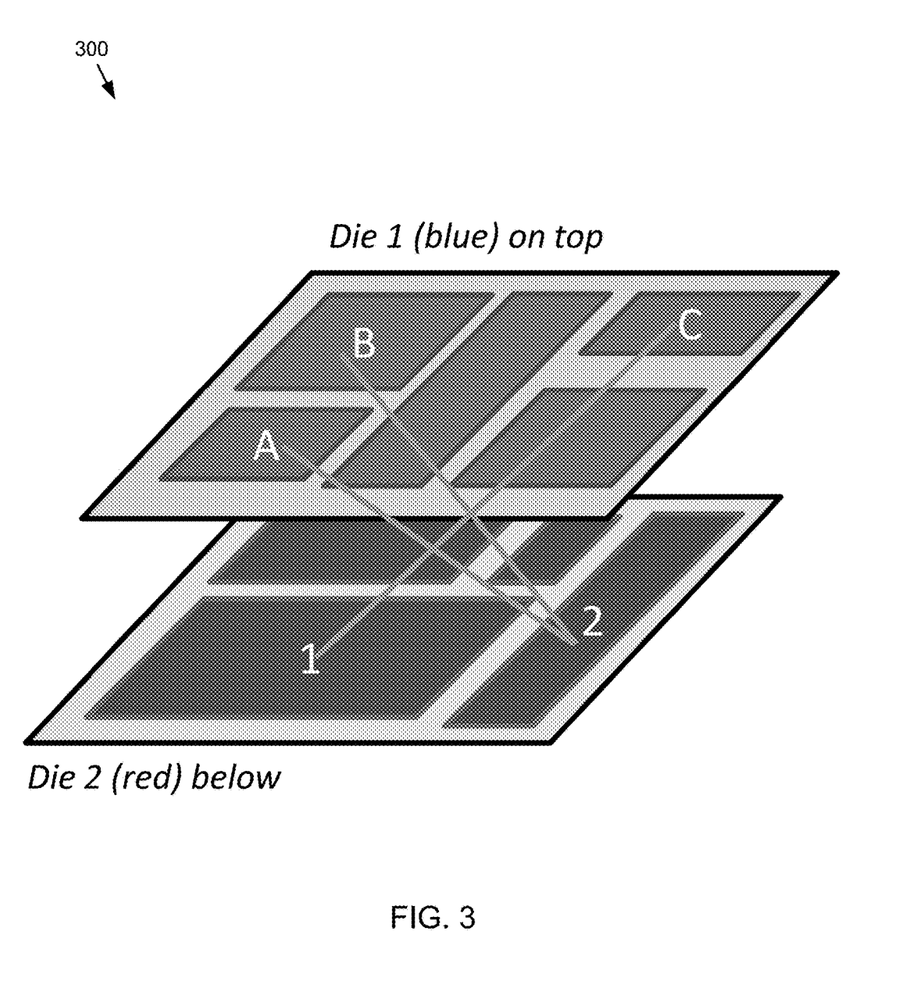
FIG. 3 is a diagram depicting an example of a floorplanning process in accordance with the present disclosure.

Referring now to FIG. 3, an example of sub-optimal floorplan is provided. This may be a result of designing each die in isolation. The lines indicate inter-block connections across the dies. There are long connections and crisscross-ing, due to poor placement of blocks.

Figure 4:
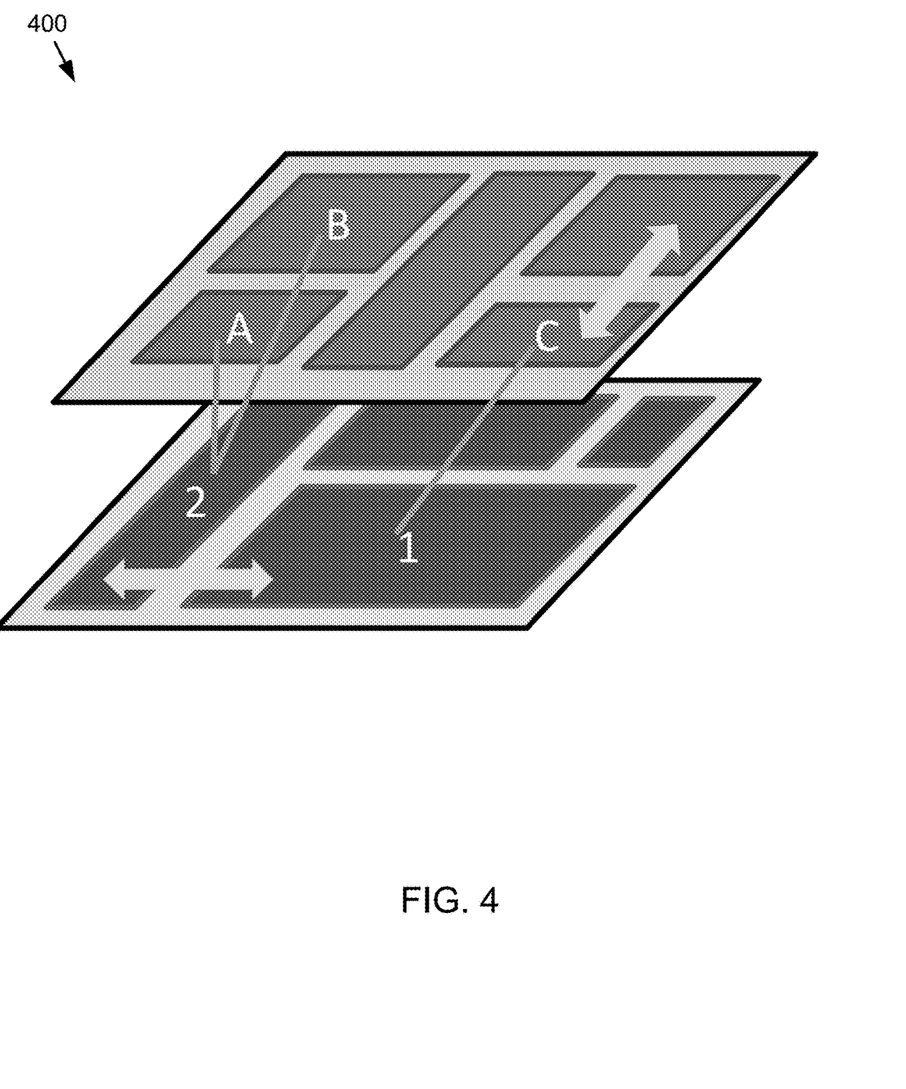
FIG. 4 is a diagram depicting an example of a floorplanning process in accordance with the present disclosure.

Referring now to FIG. 4, an example of an improved floorplan is provided. The arrows in this example show the swapped blocks. The dies are floorplanned keeping in view both intra-die and inter-die connectivity. Embodiments of floorplanning process 10 may allow for short connectivity lines and no crisscross, due to optimal placement of blocks.

Figure 5:
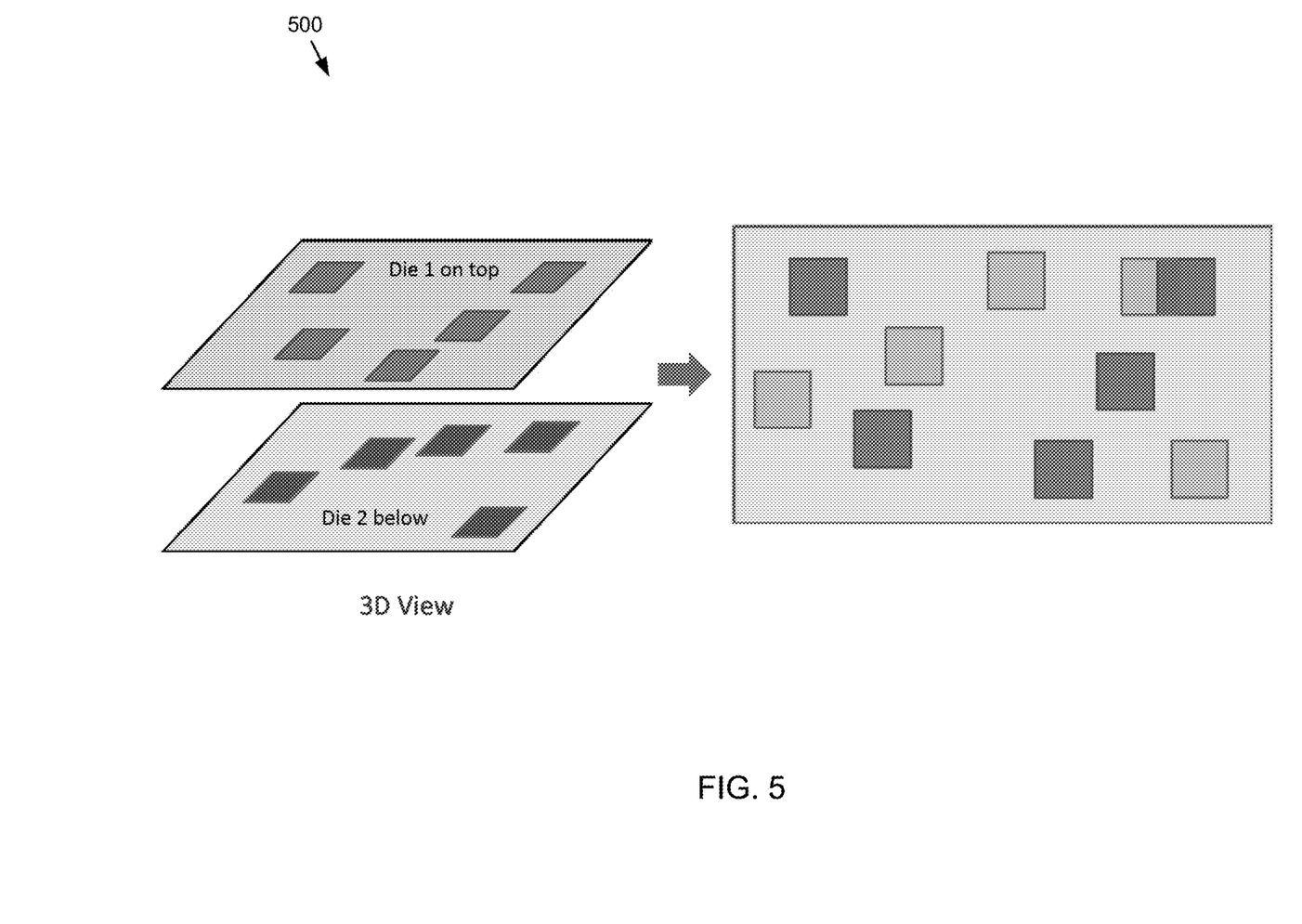
FIG. 5 is a diagram depicting an example of a floorplanning process in accordance with the present disclosure.

Referring now to FIG. 5, an example showing stacked dies is provided. In this example, in order to visualize stacked dies, a Co-Design View is provided, wherein one die is in the foreground (e.g., active/editable) and an adjacent die is in background. This display may allow a designer to view one die in the context of an adjacent die on their 2D canvas. The Co-Design view may be used to represent a stacked assembly. FIG. 5 depicts a 3D view and its co-design view.

Figure 6:
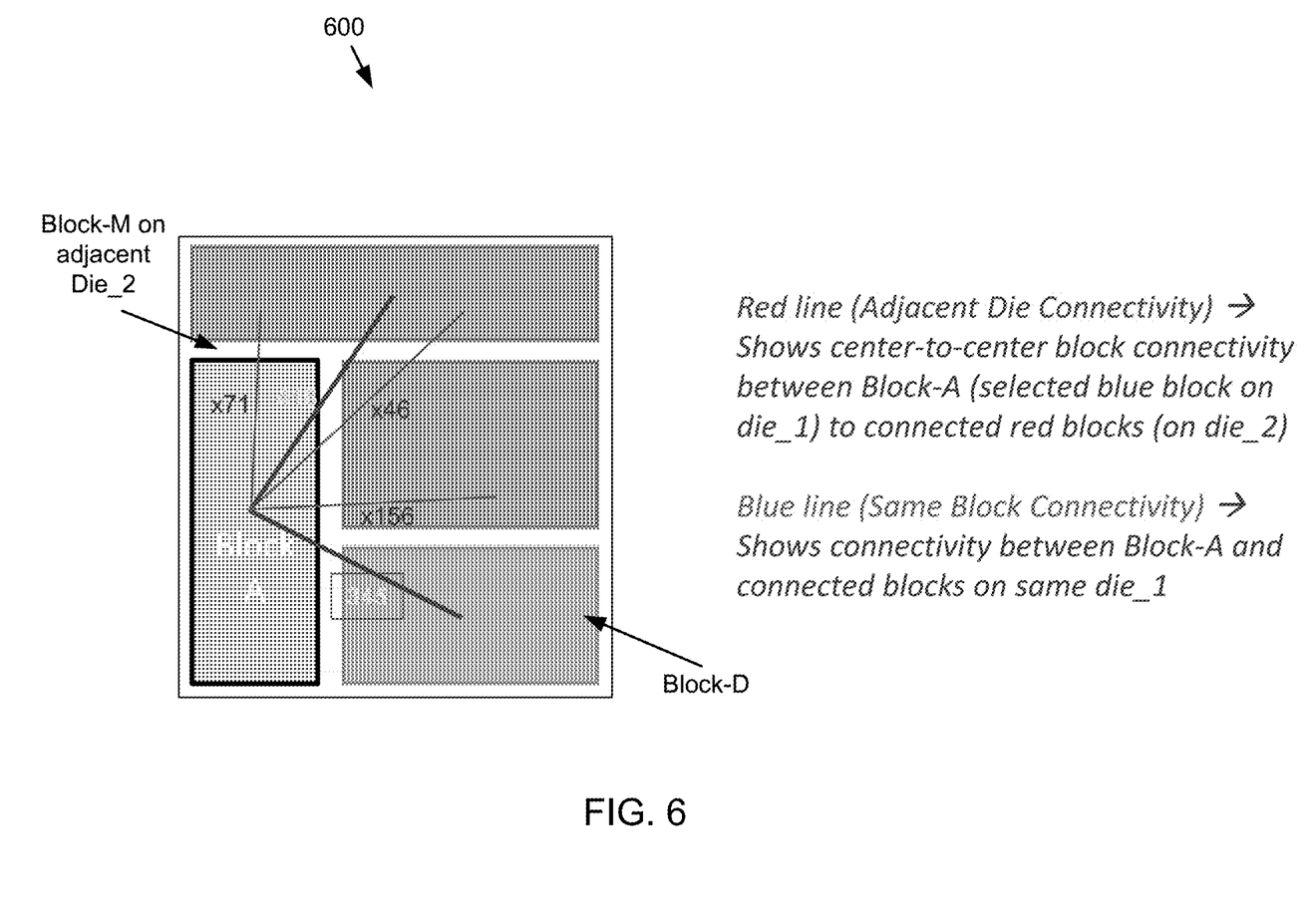
FIG. 6 is a diagram depicting an example of a floorplanning process in accordance with the present disclosure.

Referring now to FIG. 6, an embodiment of floorplanning process 10 showing a cross-die block connectivity analyzer is provided. As shown in the Figure, this example provides the ability to view and analyze connectivity between blocks from adjacent dies. In this way, floorplanning process 10 makes it easier to decide where to place the blocks on each die, such that both inter-die and intra-die block positioning is optimized. In some embodiments, same-die and cross-die connectivity may be shown in different colors and/or styles to distinguish easily. As shown in FIG. 6, the red line may indicate adjacent die connectivity. In this example, center to center block connectivity between Block A (e.g. selected blue block on die 1) to connected red blocks on die 2. The blue line may indicate connectivity between Block A and connected blocks on the same die (e.g. die 1). Moreover, as depicted in FIG. 6, cross die connectivity may also be indicated by text (e.g. the "X" shown on the diagram. In some embodiments, floorplanning process 10 may provide net count indicators both for cross die and same die connections. The numbers displayed may indicate the number of connected nets between blocks. For example, x71 may indicate 71 nets connect Block-A (die_1) and Block-M (die_2). Whereas no "x" may indicate the same die. For example, 345 nets connect Block-A and Block-D, both on die_1.

Figure 7:
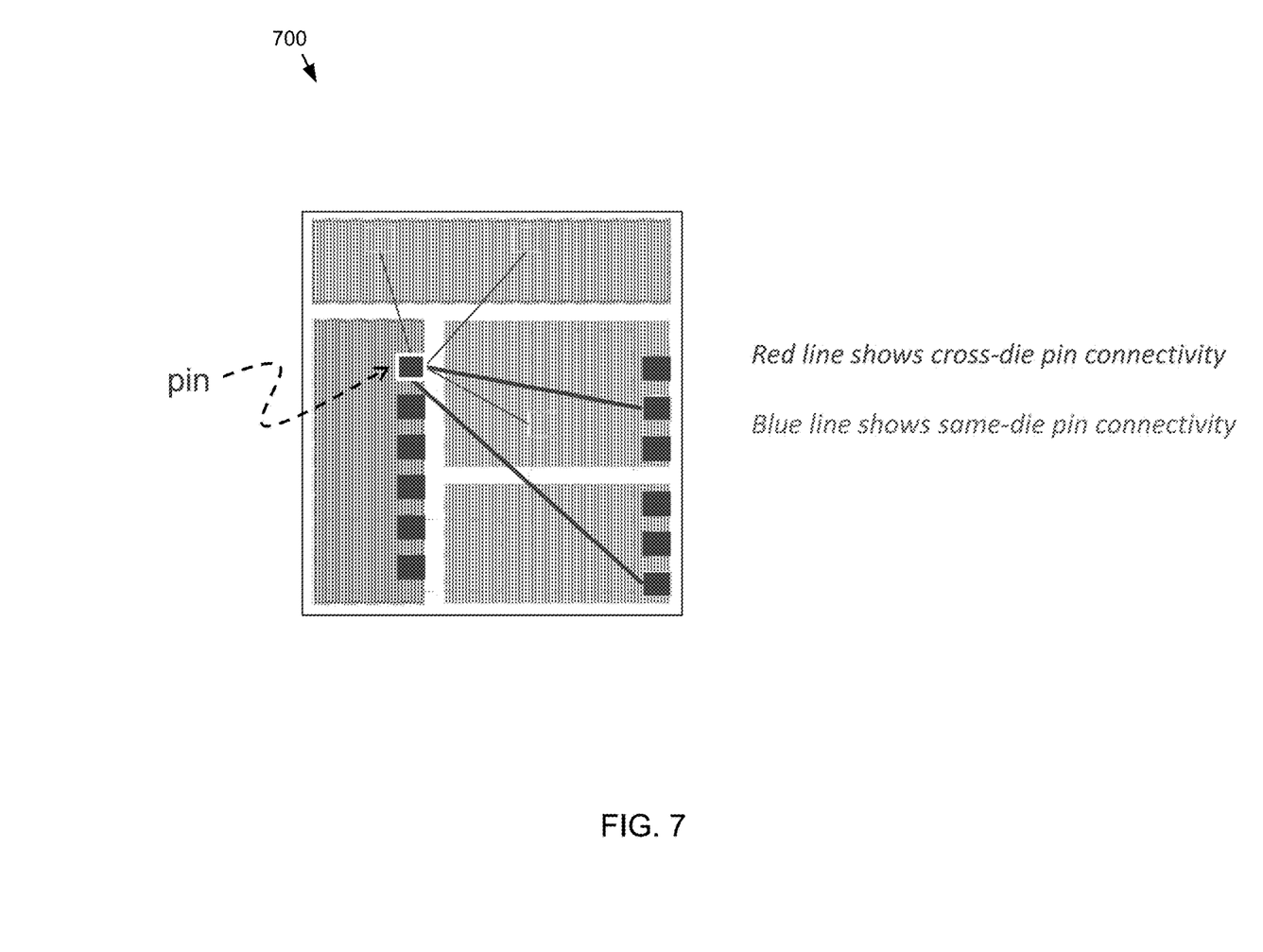
FIG. 7 is a diagram depicting an example of a floorplanning process in accordance with the present disclosure.

Referring also to FIG. 7, in some embodiments, floorplanning process 10 may provide a cross-die PIN connectivity analyzer. This may show connectivity between connected pins on adjacent dies. This may provide advantages such as making it easier to decide pin positioning to reduce route lengths. Same-die and cross-die connectivity may be shown in different colors and/or styles to distinguish more easily.

In some embodiments, floorplanning process 10 may be configured to provide cross-die synchronized editing for blocks and pins. In floorplanning, block and pin editing may be performed to ensure proper positioning, shape and size. The same may be required when cross-die floorplanning is performed. Smart synchronization between the dies is required. For example, if a designer makes any edits on a block on Die_1, the connected block on Die_2 should also mirror similar edits. In a "move" command for instance, it is often desired that connected blocks on adjacent dies move together to retain their relative positioning. Moreover, if a user spends effort to make a complex rectilinear block shape on Die_1, he or she may want the connected block on Die_2 to have the same shape/size and overlap. Accordingly, replicating the shape and size for adjacent blocks in one step may be beneficial. In some embodiments, these synchronized edits may be DRC aware and hence will not cause DRC violations on any of the dies. These capabilities save user the effort to replicate work across the dies.

Figure 8:
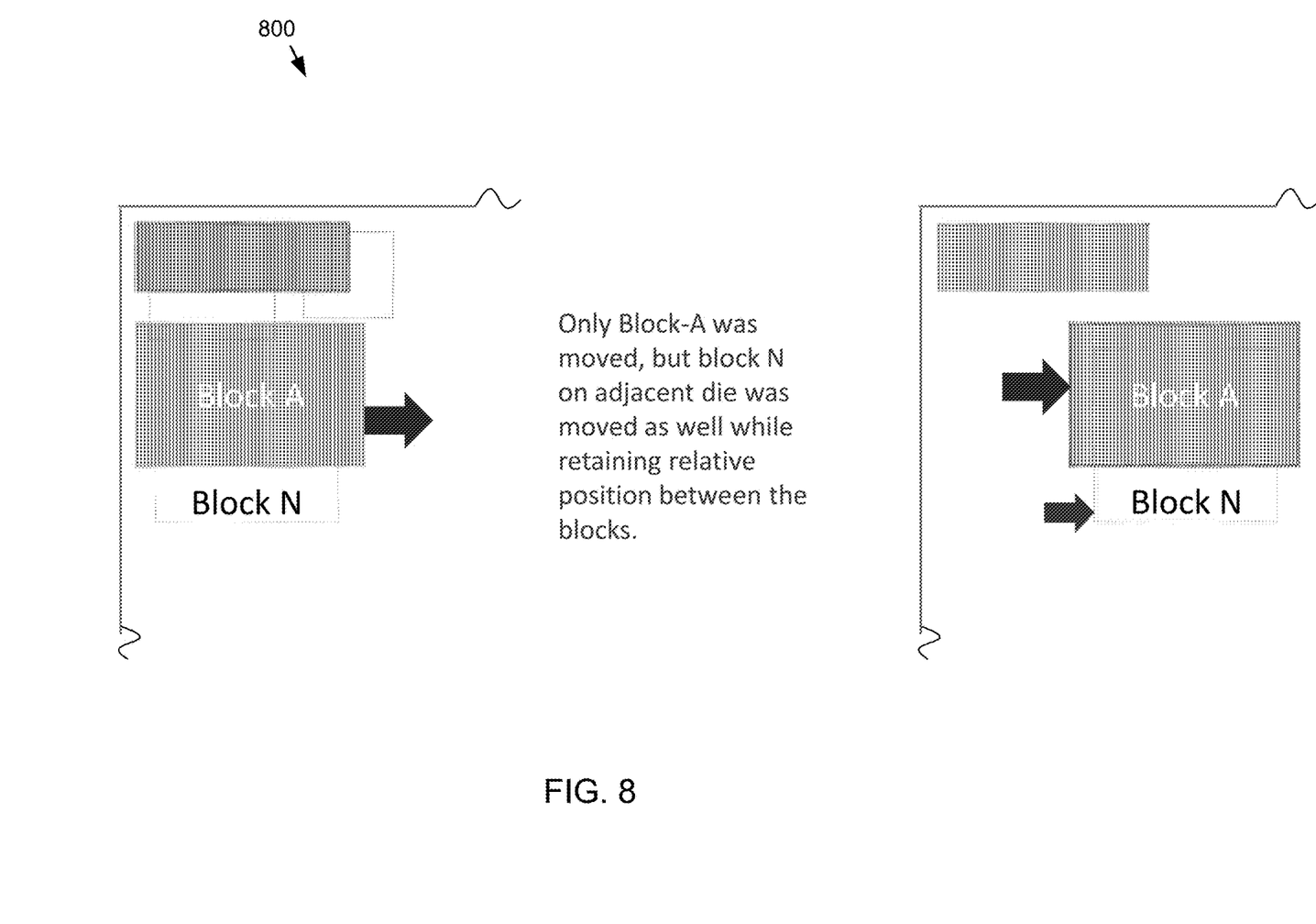
FIG. 8 is a diagram depicting an example of a floorplanning process in accordance with the present disclosure.

Referring now to FIG. 8, an embodiment of floorplanning process 10 depicting cross-die synchronized movement of blocks. When a user moves a block on one die, the connected block on the other die also moves along with it. Accordingly, this ensures that the connected blocks may be stacked vertically above each other, while retaining their relative positions, without the user having to modify and adjust them individually. In some embodiments, floorplanning process 10 may provide the user with the flexibility to define which cross-die blocks need to be synchronized. A similar capability may be provided in a Die-Package-Board co-design as well. Similarly, these approaches may be applicable for pins, other components, etc.

Figure 9:
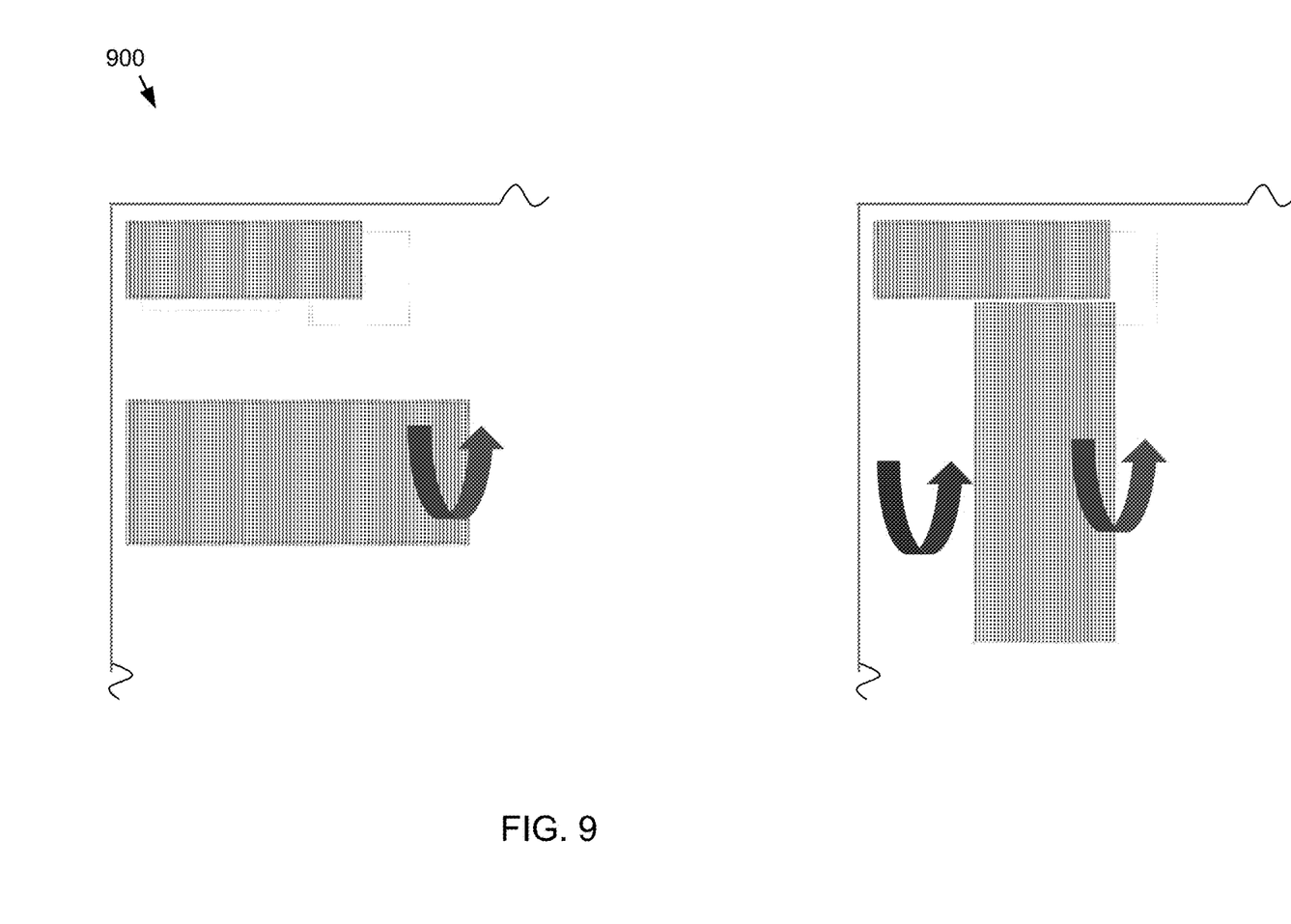
FIG. 9 is a diagram depicting an example of a floorplanning process in accordance with the present disclosure.

Referring also to FIG. 9, an embodiment of floorplanning process 10 showing a cross die synchronized rotation example is provided. In this example, when a block on Die_1 is rotated, the user-specified connected block on Die_2 may also rotate along with it. Again, the same may be applicable for pins, which may be particularly useful for rectangular pins.

Figure 10:
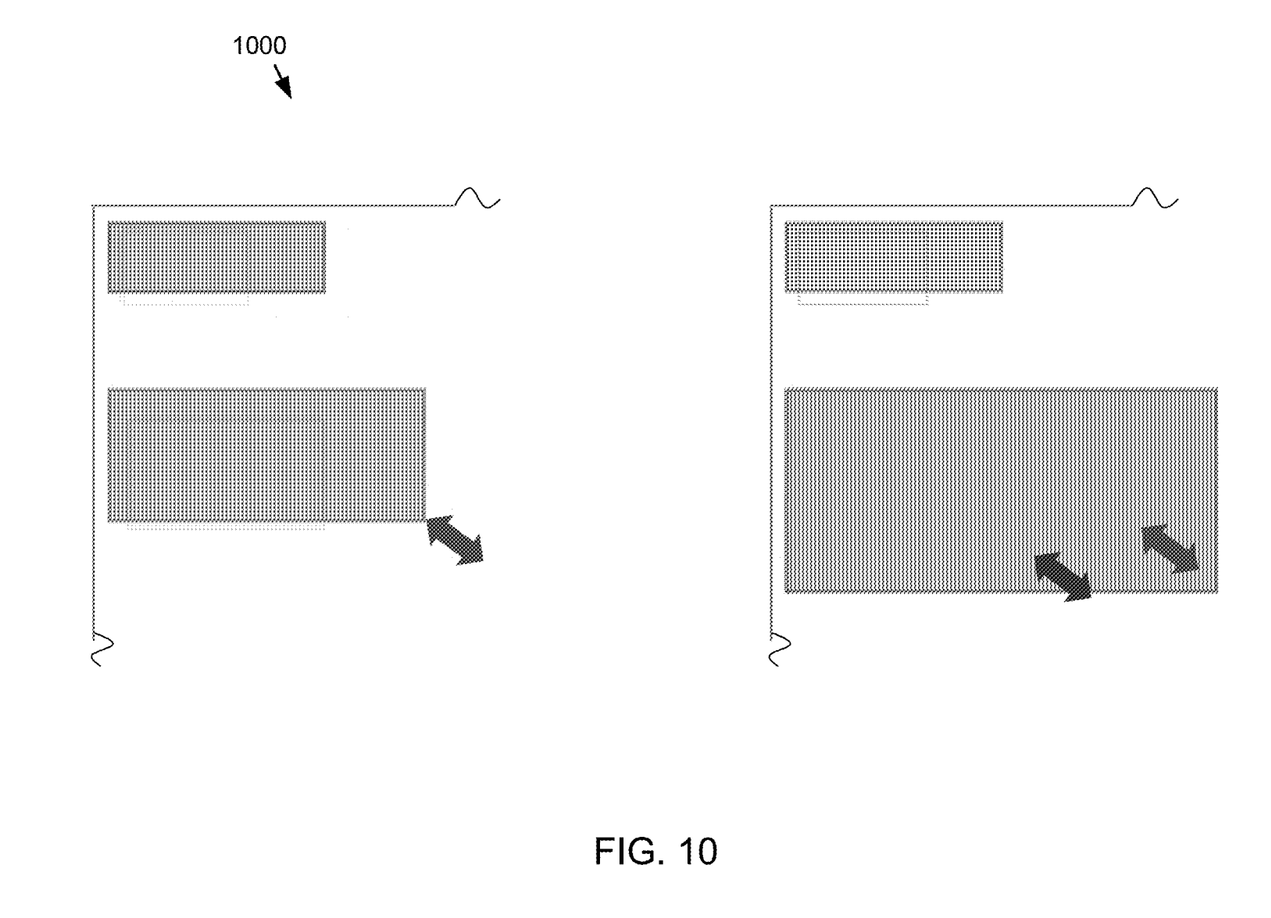
FIG. 10 is a diagram depicting an example of a floorplanning process in accordance with the present disclosure.

Referring also to FIG. 10, an embodiment of floorplanning process 10 showing a cross die synchronized stretch example is provided. In this example, when one block is edited, for example stretched, the connected block on an adjacent die may also be stretched in same proportion. In this way, a user may have the option to maintain same relative size as shown here, or ensure the same percentage of increase/decrease of size.

Figure 11:
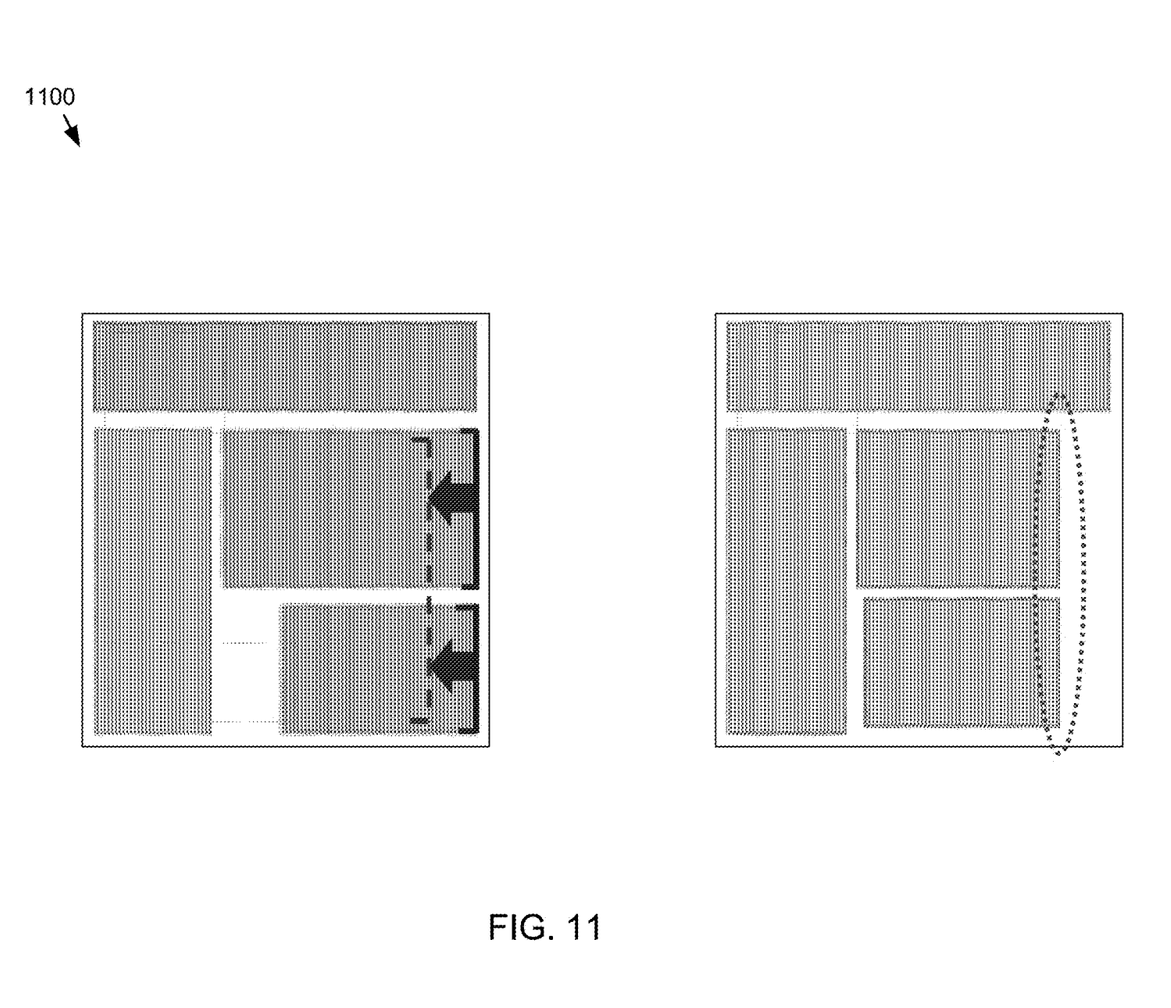
FIG. 11 is a diagram depicting an example of a floorplanning process in accordance with the present disclosure.

Referring also to FIG. 11, an embodiment of floorplanning process 10 showing a cross die block edge alignment example is provided. In this example, a user may align the edges of connected blocks across dies in one step. Here, the blue edges (e.g., on Die_1) may snap to the red edge (e.g., on Die_2). For example, the system may change the sizes of the blue block shown in FIG. 11 and it may recognize that the user is trying to find the edge of the red block. The system may prompt a move to the red edge. The red dotted line may appear on the display and the blue lines may appear for ease of use.

Figure 12:
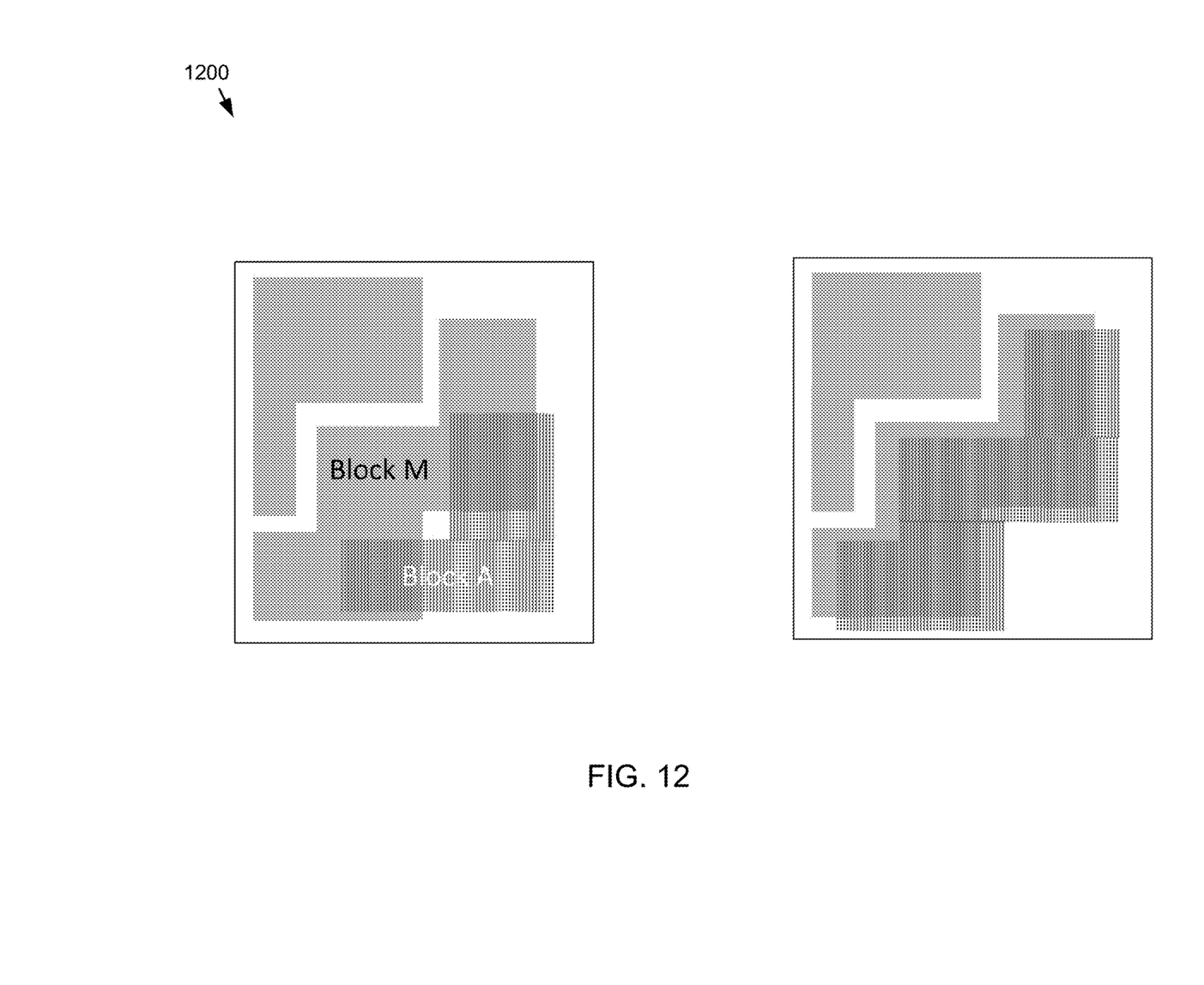
FIG. 12 is a diagram depicting an example of a floorplanning process in accordance with the present disclosure.

Referring also to FIG. 12, an embodiment of floorplanning process 10 showing a cross die automatic block shape/size matching example is provided. In this example, a user may modify the shape of a block on Die-2 to replicate the shape of the connected (and user-specified) block on Die-2. For example, a user may have spent a lot of effort to create a certain rectilinear shape for Block-M on Die_2. Now, he or she may want connected Block-A on Die_1 to have the same shape. Accordingly, this may be achieved in one-step, without duplicating the block shaping effort. If desired, he or she may perfectly overlap them using cross-die block align.

Accordingly, embodiments of floorplanning process 10 may allow for easy analysis and visualization of cross-die connectivity and may also allow for simultaneous cross-die and same-die connectivity analysis, which may enable optimal floorplan decision-making. Additionally and/or alternatively, embodiments of floorplanning process 10 may allow for easy cross-die floorplanning using features like cross-die synchronized editing. The present disclosure may allow for simultaneous cross-die and same-die layout editing to achieve an optimal floorplan. The synchronized editing techniques described herein may greatly reduce an engineer's effort as a design action or design topology is auto-synchronized across stacked dies. In this way, the engineer does not need to replicate for each die separately.

It will be apparent to those skilled in the art that various modifications and variations can be made in the embodiments of the present disclosure without departing from the spirit or scope of the present disclosure. Thus, it is intended that embodiments of the present disclosure cover the modifications and variations provided they come within the scope of the appended claims and their equivalents.

What is claimed is:

1. A computer-implemented method for use in an electronic circuit design comprising:
   receiving, using at least one processor, the electronic circuit design;
   displaying, via a graphical user interface, a first device associated with the electronic circuit design;
   displaying, via the graphical user interface, a second device associated with the electronic circuit design, wherein the first device corresponds to a first die and the second device corresponds to a second die; and
   displaying, via the graphical user interface, inter-device connectivity between the first device and the second device and displaying intra-device connectivity within at least one of the first device and the second device, wherein displaying, via the graphical user interface, intra-die connectivity within at least one of the first die and the second die includes displaying same-die pin connectivity, wherein the inter-device connectivity and the intra-device connectivity are visibly distinct.

2. The computer-implemented method of claim 1 further comprising:
   displaying, via the graphical user interface, a number of connected nets between the first device and the second device on the graphical user interface.

3. The computer-implemented method of claim 1 further comprising:
   displaying, via the graphical user interface, a number of connected nets between a plurality of blocks associated with at least one of the first device and the second device on the graphical user interface.

4. The computer-implemented method of claim 1 wherein displaying, via the graphical user interface, inter-device connectivity between the first device and the second device includes displaying cross-die pin connectivity.

5. A computer-readable storage medium for use in an electronic circuit design, the computer-readable storage medium having stored thereon instructions that when executed by a machine result in the following operations:
   receiving, using at least one processor, the electronic circuit design, wherein the electronic circuit design comprises a stacked assembly;
   displaying, via a graphical user interface, a first device associated with the stacked assembly in the electronic circuit design, wherein the first device is a die;
   displaying, via the graphical user interface, a second device associated with the stacked assembly in the electronic circuit design; and
   displaying through a plurality of connected nets, via the graphical user interface, inter-device connectivity between the first device and the second device and intra-device connectivity within at least one of the first device and the second device, wherein displaying, via the graphical user interface, intra-die connectivity within at least one of the first die and the second die includes displaying same-die pin connectivity, wherein the inter-device connectivity and the intra-device connectivity are visibly distinct.

6. The computer-readable storage medium of claim 5, further comprising:
   displaying, via the graphical user interface, a third device associated with the stacked assembly in the electronic circuit design, wherein the second device is a package and the third device is a printed circuit board.

7. The computer-readable storage medium of claim 5, wherein the second device is a die.

8. The computer-readable storage medium of claim 7, wherein displaying, via the graphical user interface, inter-device connectivity between the first device and the second device includes displaying cross-die pin connectivity.

9. A system for use with an electronic circuit design comprising:
   a computing device having at least one processor configured to receive the electronic circuit design and to display, via a graphical user interface, a first die associated with the electronic circuit design, the at least one processor further configured to display, via the graphical user interface, a second die associated with the electronic circuit design, the at least one processor further configured to display, via the graphical user interface, inter-die connectivity between the first die and the second die and to display intra-die connectivity within at least one of the first die and the second die, wherein displaying, via the graphical user interface, intra-die connectivity within at least one of the first die and the second die includes displaying same-die pin connectivity, wherein the inter-die connectivity and the intra-die connectivity are visibly distinct.

10. The system for use with an electronic circuit design of claim 9, wherein the at least one processor is further configured to:
    display, via the graphical user interface, a number of connected nets between the first die and the second die on the graphical user interface.

11. The system for use with an electronic circuit design of claim 9, wherein the at least one processor is further configured to:
    display, via the graphical user interface, a number of connected nets between a plurality of blocks associated with at least one of the first die and the second die on the graphical user interface.

12. The system for use with an electronic circuit design of claim 9, wherein displaying, via the graphical user interface, inter-die connectivity between the first die and the second die includes displaying cross-die pin connectivity.

\* \* \* \* \*